United States Patent [19]
Henry et al.

[11] 4,386,339
[45] May 31, 1983

[54] DIRECT FLASH ANALOG-TO-DIGITAL CONVERTER AND METHOD

[75] Inventors: Tim W. Henry, Colorado Springs, Colo.; Mark P. Morgenthaler, Palo Alto, Calif.

[73] Assignee: Hewlett-Packard Company, Palo Alto, Calif.

[21] Appl. No.: 366,038

[22] Filed: Apr. 5, 1982

Related U.S. Application Data

[63] Continuation of Ser. No. 135,751, Mar. 31, 1980, abandoned.

[51] Int. Cl.³ .......................................... H03K 13/02
[52] U.S. Cl. ............................ 340/347 AD; 307/361
[58] Field of Search ................. 340/347 AD, 347 M; 307/361

[56] References Cited

U.S. PATENT DOCUMENTS

| | | | |
|---|---|---|---|
| 2,922,151 | 1/1960 | Reiling | 340/347 AD |
| 3,573,798 | 4/1971 | Reiling | 340/347 AD |
| 3,644,924 | 2/1972 | Kitaguchi | 340/347 AD |
| 3,806,915 | 4/1974 | Higgins | 340/347 AD |
| 3,829,853 | 8/1974 | Freedman | 340/347 AD |
| 3,877,025 | 4/1975 | Maio | 340/347 AD |
| 4,057,795 | 11/1977 | Timsit | 340/347 AD |

FOREIGN PATENT DOCUMENTS 2805436 8/1979 Fed. Rep. of Germany ...... 340/347 AD

*Primary Examiner*—C. D. Miller
*Attorney, Agent, or Firm*—Edward Y. Wong

[57] ABSTRACT

A direct flash converter has independent parallel analog-to-digital encoders for each bit. Cross-coupled level sensors are coupled to a single comparator within each bit encoder to provide a directly encoded Gray code binary output.

10 Claims, 23 Drawing Figures

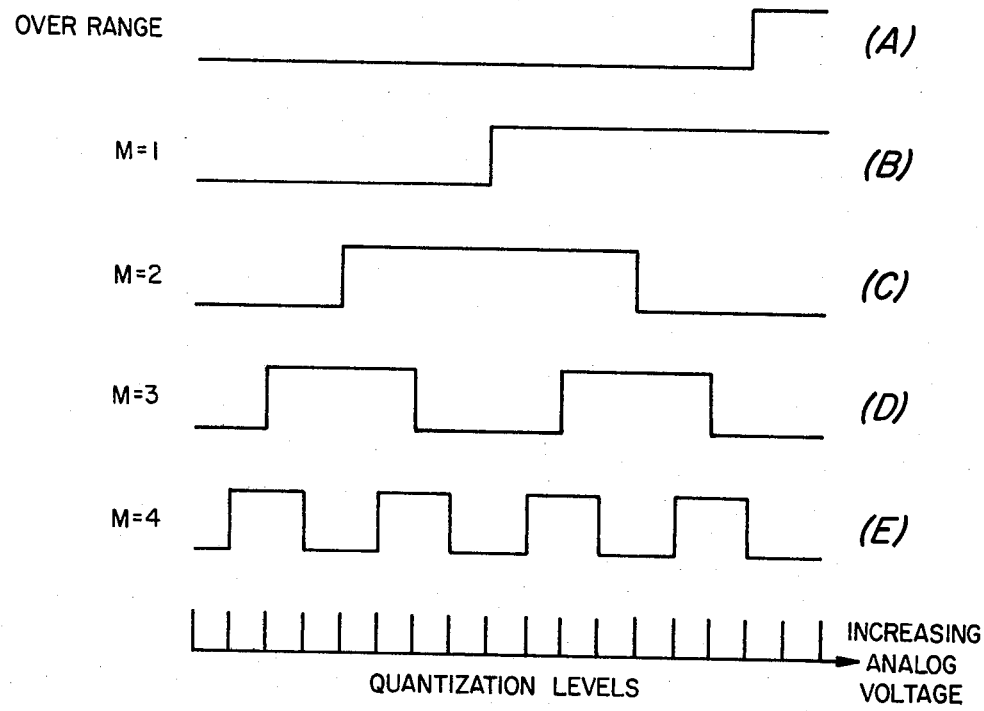
FIG_1
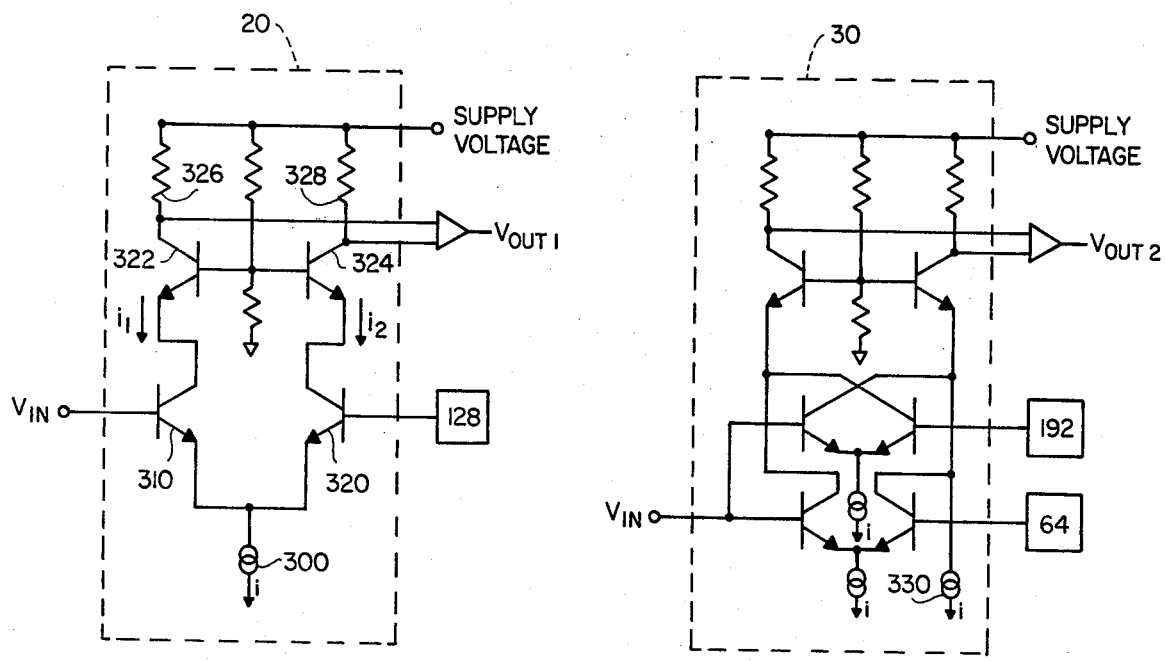
FIG_3  FIG_4

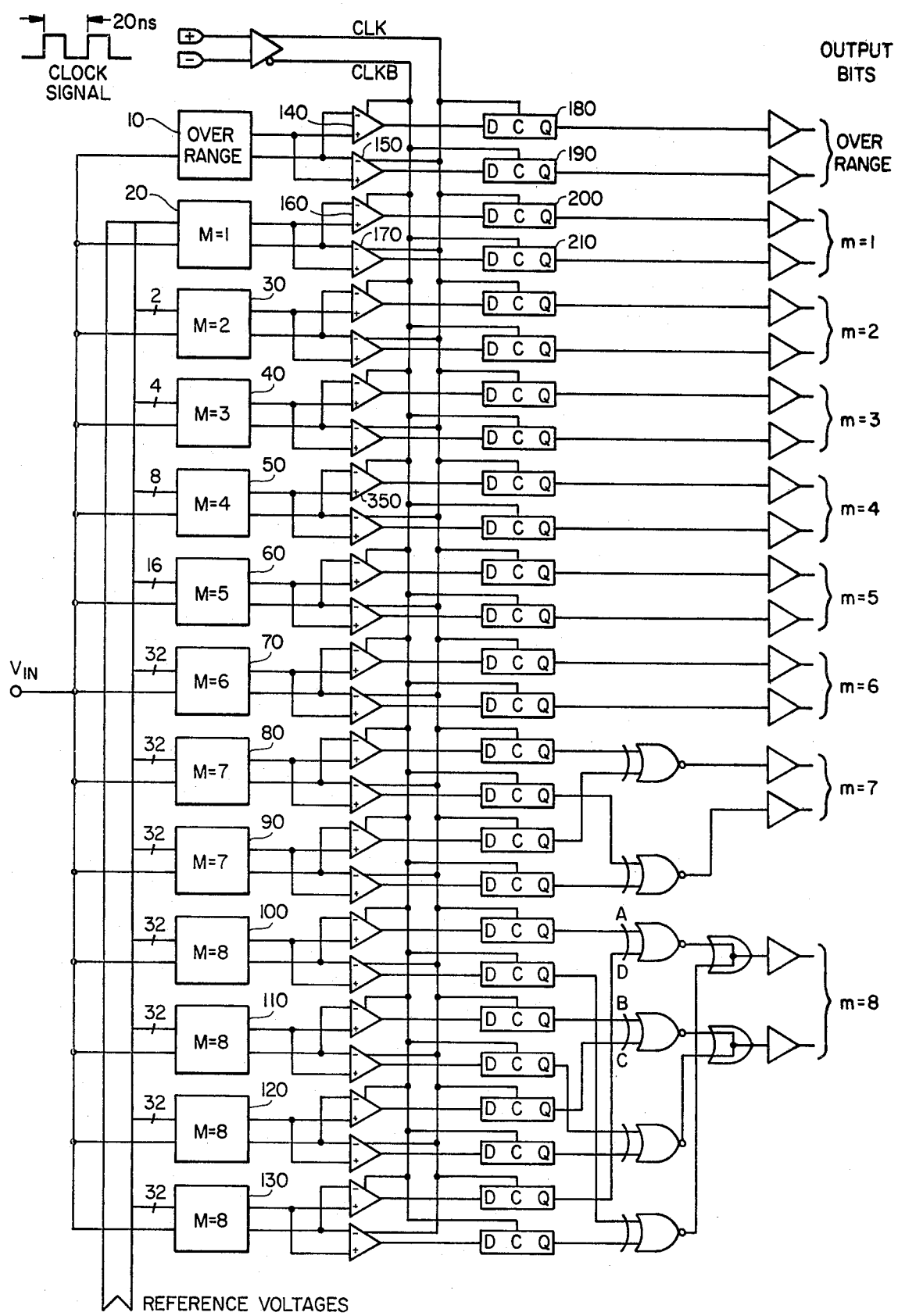
FIG_2

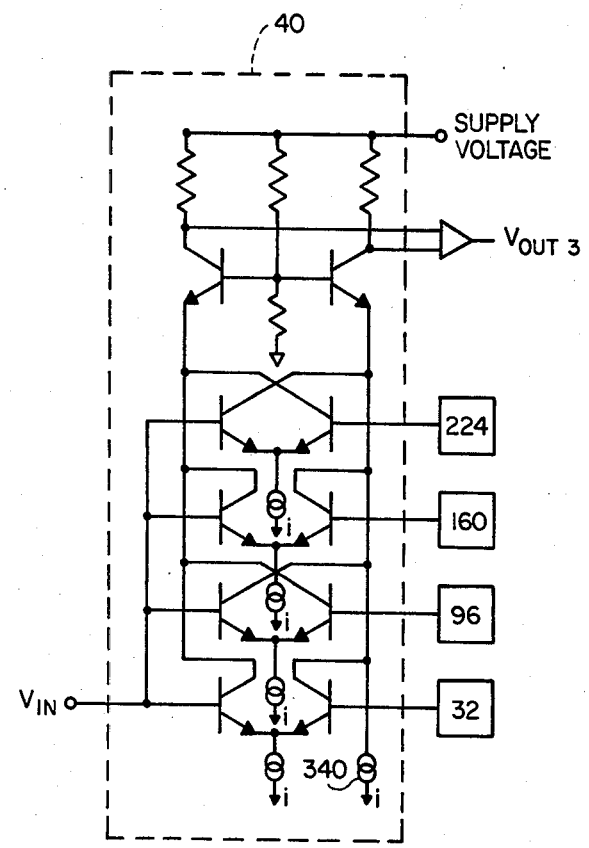
FIG_5
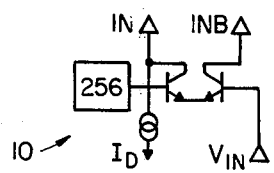
FIG_7A
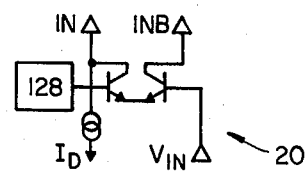
FIG_7B
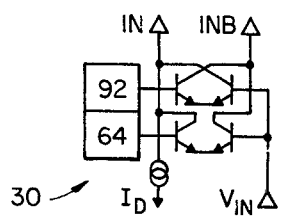
FIG_7C
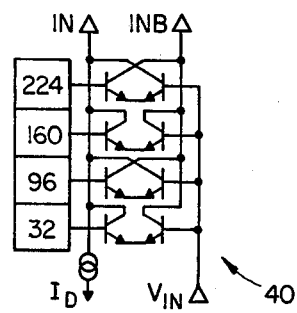
FIG_7D

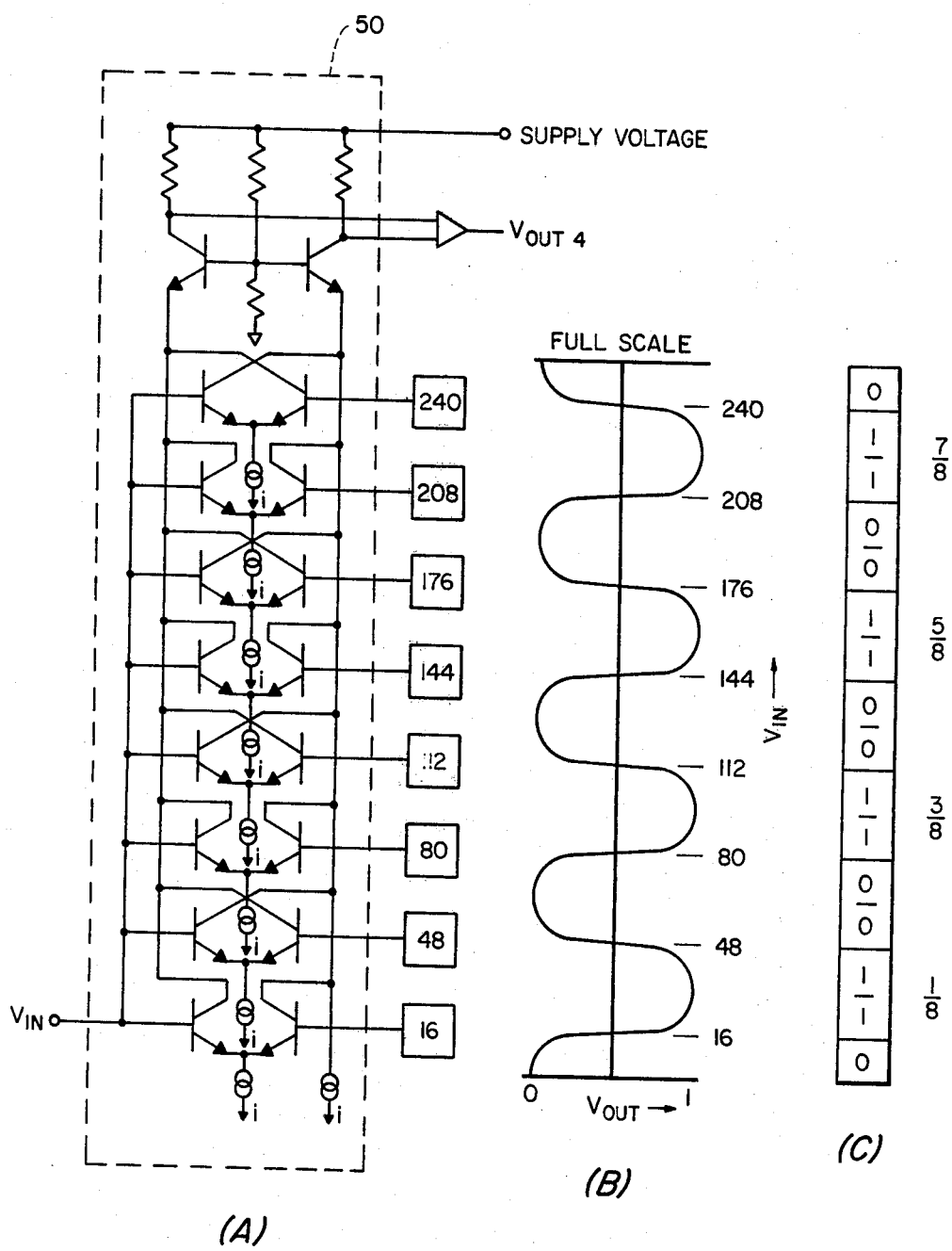
FIG_6

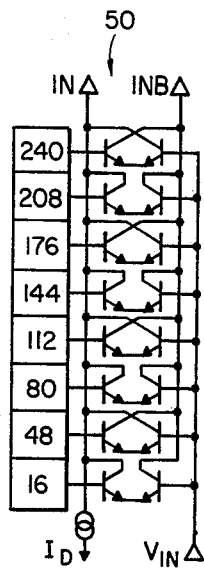
FIG_7E
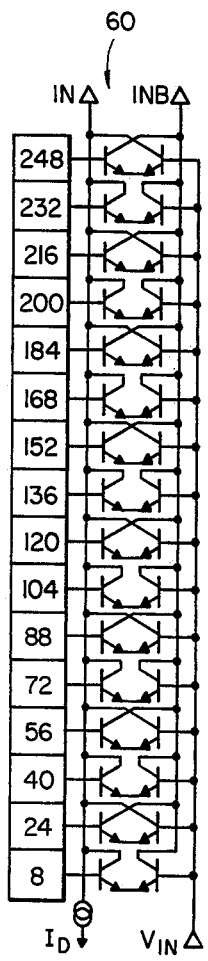
FIG_7F
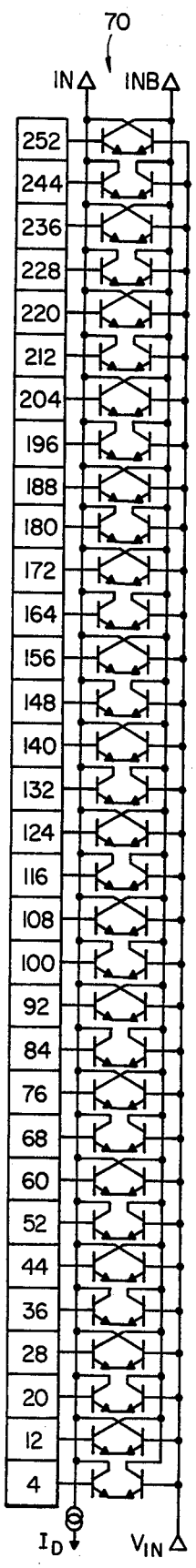
FIG_7G
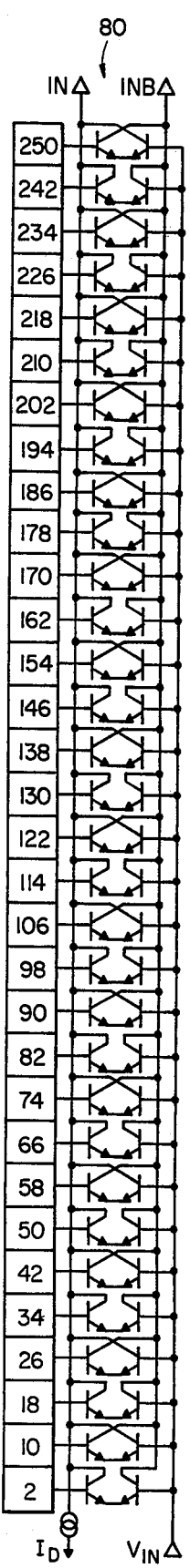
FIG_7H

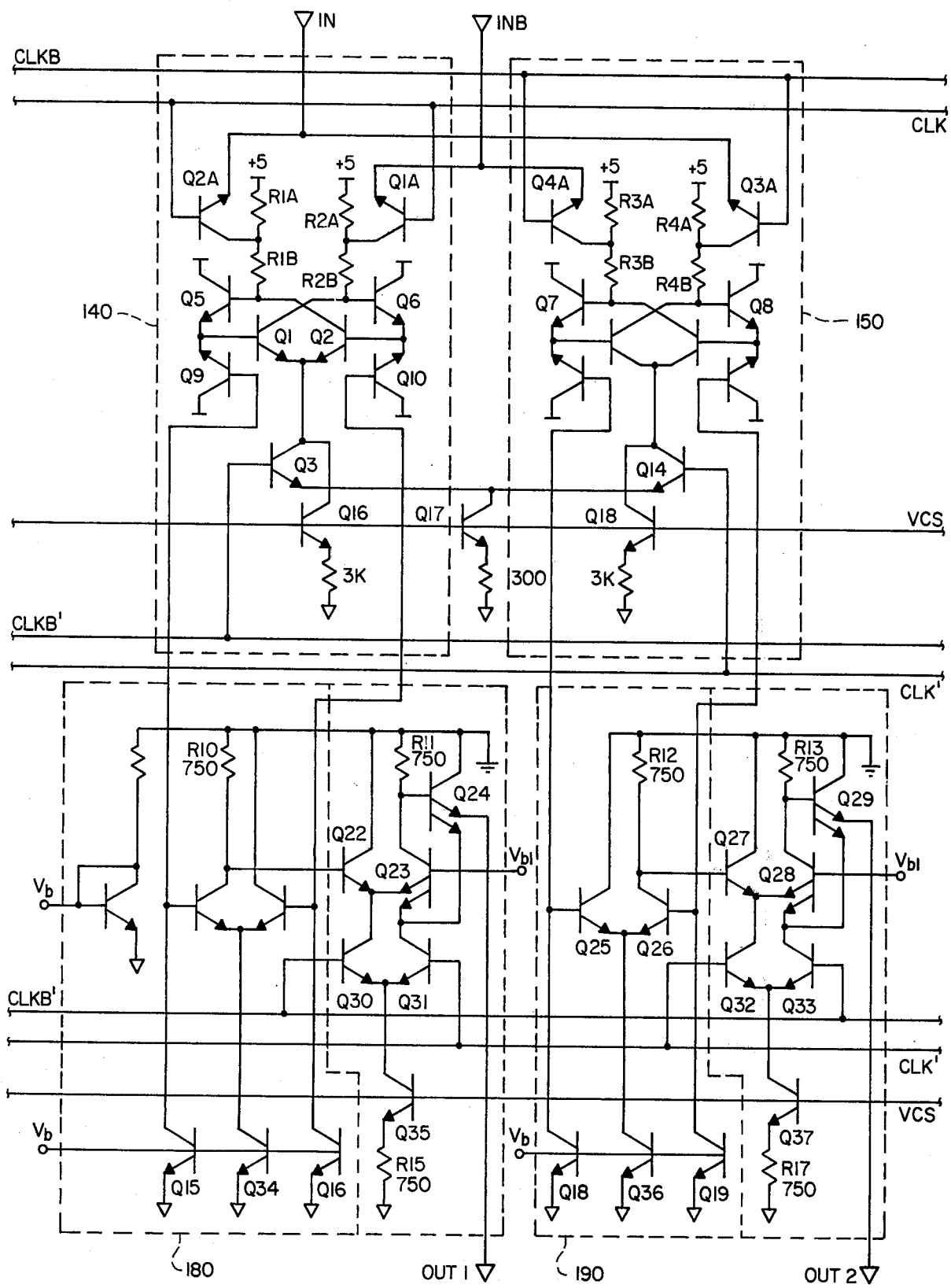
FIG_8

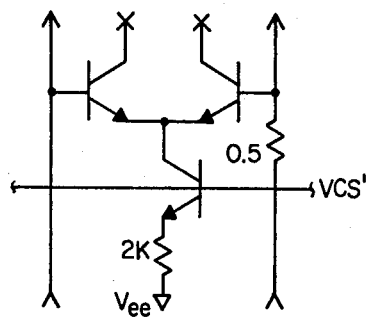
FIG_9
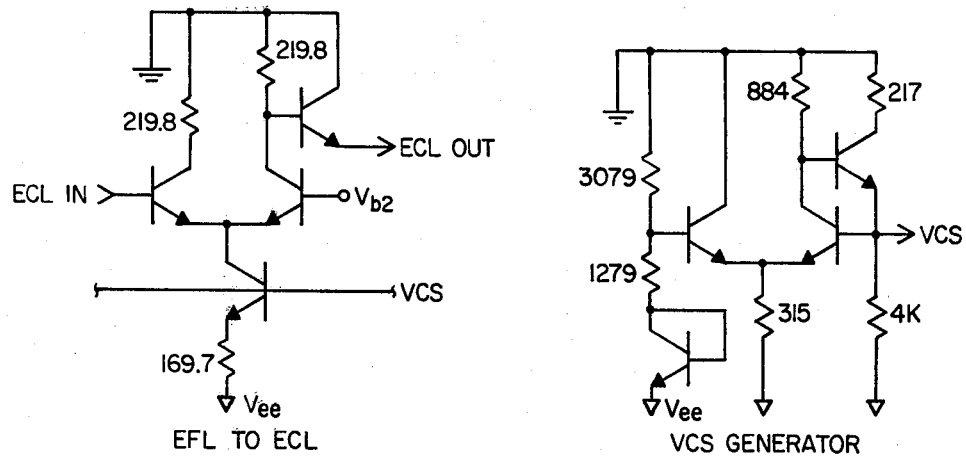
FIG_10     FIG_11
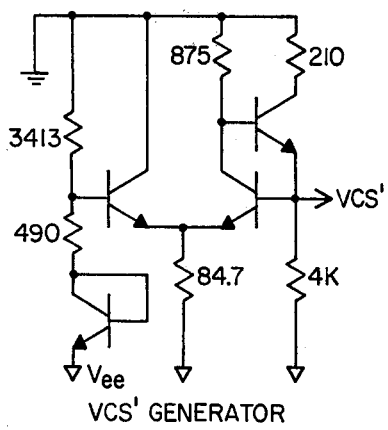 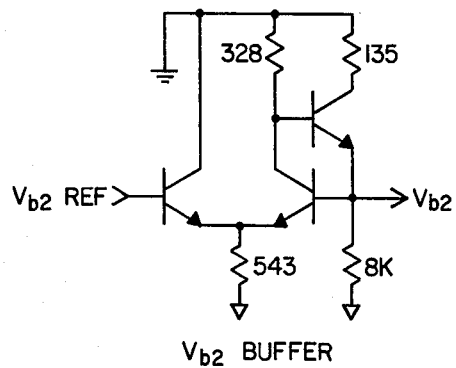
FIG_12     FIG_13

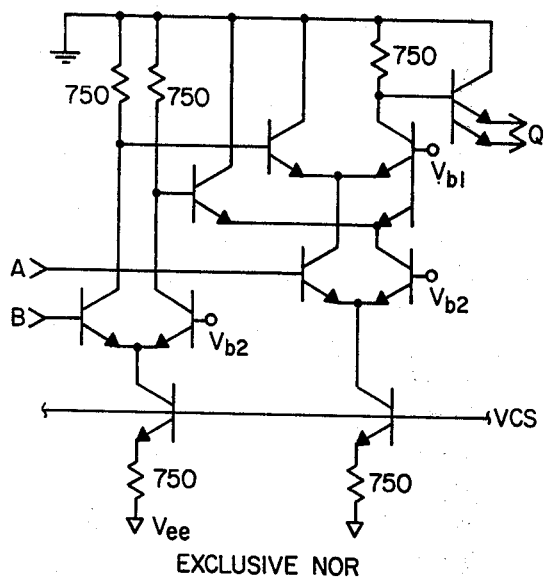
EXCLUSIVE NOR
FIG_14
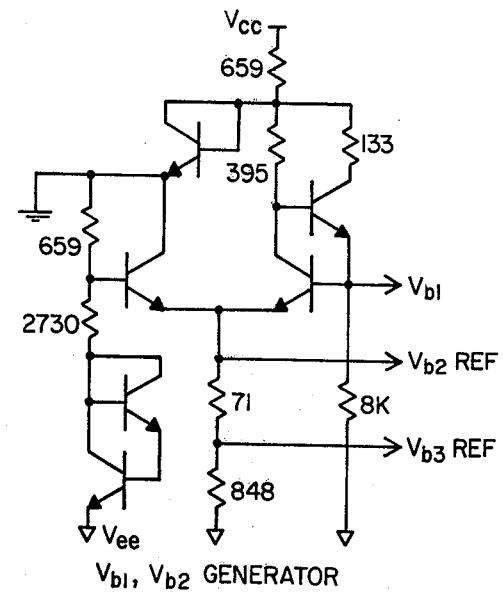
$V_{b1}$, $V_{b2}$ GENERATOR
FIG_16
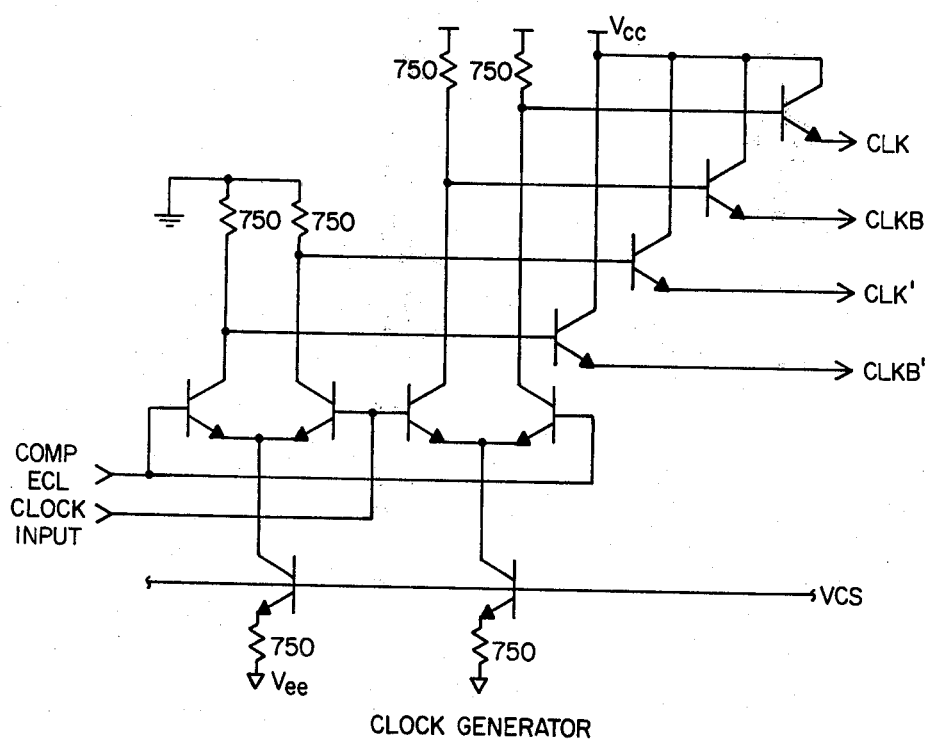
CLOCK GENERATOR
FIG_15

4,386,339

DIRECT FLASH ANALOG-TO-DIGITAL CONVERTER AND METHOD

This is a continuation of application Ser. No. 135,751, filed Mar. 31, 1980 abandoned.

BACKGROUND OF THE INVENTION

In the simultaneous conversion method of converting an analog voltage to a digital representation, all bits of the digital representation are determined simultaneously. This method is also known as the parallel method because the conventional implementation of this method has a parallel bank of voltage comparators, each comparator being responsive to the analog voltage attaining a predetermined voltage level.

In an N-bit encoder where N is a predetermined integer, there are exactly $2^N$ digital output states. A maximum analog voltage is divided into $2^N$ voltage levels. Each level represents a quantum of voltage and each quantum level is represented by one of the digital output states. Conventional N-bit encoders require $2^N$ comparators; that is, each comparator determines the transition to a unique quantum level. Thus, conventional parallel implementation of the simultaneous conversion method requires a prohibitive number of comparators if N is large. In practice, one disadvantage is that the number of comparators becomes prohibitive when N is six (6) or greater. However, the ultra high-speed conversion possible with this method makes overcoming this disadvantage highly desirable.

Another disadvantage of the simultaneous conversion method is that the output from the parallel bank of voltage comparators is in the form of $2^N-1$ binary data signals rather than in a compact format. Conventionally, the $2^N-1$ outputs are further encoded to N bits of binary information in some compact binary format by conversion logic. For large values of N, typically six (6) or greater, the number of elements required in the conversion logic becomes prohibitively large because of the large number of inputs and logic combinations which must be provided for.

Thus, in the prior art, the high-speed conversion of the simultaneous conversion method, also known as "flash encoding", is not realizable for encoders characterized by high values of N because of the prohibitively large number of comparators required and the complexity of the conversion logic.

SUMMARY OF THE INVENTION

In accordance with the preferred embodiment, the present invention provides a direct flash converter having independent parallel analog-to-digital encoders for each bit. Each independent bit-encoder has cross-coupled level sensors coupled to a single comparator in accordance with the preferred embodiment such that the output of the comparator is a directly encoded compact binary output. Thus, only one comparator is required for each bit, and the need for conversion logic is eliminated, resulting in a practical, direct multi-bit flash converter.

BRIEF DESCRIPTION OF THE DRAWINGS

FIG. 1 is an illustration of five digital waveforms associated with the Gray code bit values as a function of analog input voltage.

FIG. 2 is a system block diagram of the preferred embodiment of a direct flash converter.

FIG. 3 is a detailed schematic diagram of differential amplifier cell 20.

FIG. 4 is a detailed schematic diagram of differential amplifier cell 30.

FIG. 5 is a detailed schematic diagram of differential amplifier cell 40.

FIG. 6(a) is a detailed schematic diagram of differential amplifier cell 50.

FIG. 6(b) is an illustration of the output analog voltage ($V_{OUT}$) provided by digital amplifier cell 50 of FIG. 6(a).

FIG. 6(c) shows the digital output associated with the analog voltage ($V_{OUT}$) of FIG. 6(b).

FIG. 7 contains representative schematic diagrams for same of the differential amplifier cells in FIG. 2 with their respective transitional reference voltages listed as input(s) to the left of each cell.

FIG. 8 is a detailed schematic diagram of sampling comparators 140 and 150 and data latches 180 and 190.

FIG. 9 is a detailed schematic diagram of the basic differential amplifier used in the differential amplifier cells.

FIG. 10 is a detailed schematic diagram of the EFL to ECL circuit.

FIG. 11 is a detailed schematic diagram of the VCS generator.

FIG. 12 is a detailed schematic diagram of the VCS' generator.

FIG. 13 is a detailed schematic diagram of the $V_{b2}$ buffer.

FIG. 14 is a detailed schematic diagram of the exclusive NOR circuit.

FIG. 15 is a detailed schematic diagram of the clock generator.

FIG. 16 is a detailed schematic diagram of the $V_{b1}$ and $V_{b2}$ generator.

DETAILED DESCRIPTION OF THE PREFERRED EMBODIMENT

The illustrated preferred embodiment of the present invention is a simultaneous eight-bit, Gray code, analog-to-digital converter. Each bit is encoded by independent and parallel analog circuitry coupled to a comparator for providing a directly encoded compact output. Because the present invention has parallel bit encoders and directly produces an N-bit binary code, it is referred to as a "direct flash converter". The terms "converter", in the present discussion, refers to the embodiment in general, and "encoder" refers to the circuitry within the "converter".

The preferred binary code incorporated in the illustrated preferred embodiment is a unit distance code, also known as a "cyclic code", a "reflective binary code", or, as used herein, a "Gray code", after its inventor. The states of a four-bit (N=4) Gray code as a function of quantized input voltages are tabulated in Table 1. FIG. 1 illustrates digital waveforms associated with the Gray code bit values as a function of increasing analog input voltage. Waveform (a) is associated with an over-range bit, waveforms (b), (c), (d), and (e) are associated with the Gray code of Table 1 where waveform (b) represents the most significant bit, waveform (c) represents the next most significant bit, etc. As illustrated, only one bit of the Gray code changes in response to the input signal crossing any one given quantization level.

TABLE 1

| Gray Code | Analog Amplitude (Quantization Levels) |
|---|---|
| 0000 | 0 |
| 0001 | 1 |
| 0011 | 2 |
| 0010 | 3 |
| 0110 | 4 |
| 0111 | 5 |
| 0101 | 6 |
| 0100 | 7 |
| 1100 | 8 |
| 1101 | 9 |
| 1111 | 10 |
| 1110 | 11 |
| 1010 | 12 |
| 1011 | 13 |
| 1001 | 14 |
| 1000 | 15 |

Each bit of the digital representation is encoded by an independent parallel analog-to-digital encoder. In FIG. 1, each digital output bit is characterized by digital transitions representative of analog voltages which occur $FS \div 2^{M-1}$ apart, where FS is the amplitude of the full scale analog signal and M is the integer representing the output digital bit, and M=1 corresponds to the most significant bit. Further, the first transition for each digital bit occurs at $FS \div 2^M$. For example, in a system having a full scale analog amplitude of 256 volts, the fourth digital bit, corresponding to M=4 and waveform (e) in FIG. 1, will have its first transition at 256 volts÷16=16 volts, and its quantization levels will be 32 volts apart.

One advantage of the preferred embodiment of the present invention is that the resolution of the eight-bit analog-to-digital converter decreases bit by bit as the input slew rate increases, with the encoding errors resulting from high slew rates exhibiting themselves first in the least significant bit. This in in contrast to the prior art in which random erroneous results, or glitches, occur when the maximum slew rate is exceeded.

In FIG. 2, a system block diagram of the preferred embodiment, a number of differential amplifier cells numbered 10, 20, 30, 40, 50, 60, 70, 80, 90, 100, 110, 120, and 130 are coupled to receive the input analog signal $V_{IN}$. Further, each differential amplifier cell, which contains individual differential amplifiers, is coupled to receive a predetermined set of transition reference voltages. In one preferred embodiment of the invention, there are $2^N$-1 transition reference voltages which increase monotonically with n, where N is an integer greater than zero, and n is an integer designating one of the transition reference voltages such that $1 \leq n \leq 2^N - 1$. As will be explained in detail below, each differential amplifier cell provides a differential output in response to the applied input analog signal and the received transition reference voltages. In essence, the differential amplifiers in the differential amplifier cell act as level sensors with a transition reference voltage for the reference level. For instance, the overrange differential amplifier cell 10 provides (1) an output signal (IN) corresponding to waveform (a) of FIG. 1 having a low voltage level if the input analog signal $V_{IN}$ is less than the full scale (256) transitional reference voltage, and (2) a high voltage level if the input analog signal $V_{IN}$ is greater than the full scale transitional reference voltage. Differential amplifier cell 20 is coupled to a half-scale (128) transitional reference voltage and provides an output differential signal corresponding to waveform (b) of FIG. 1. Similarly, differential amplifier cells 30, 40, and 50 provide differential output signals corresponding to waveforms (c), (d), and (e), respectively, of FIG. 1.

Differential amplifier cells 20, 30, 40, 50, 60, and 70 each comprise independent parallel analog-to-digital encoders. Each of these differential amplifier cells has additional outputs coupled to two sampling comparators. For example, differential amplifier cell 10 has output lines IN and INB coupled to sampling comparators 140 and 150, respectively. Differential amplifier cell 20 is similarly coupled to sampling comparators 160 and 170. The sampling comparators are characterized by high gain such that the output from these comparator gain elements is essentially digital.

These comparators operate in the comparison mode in response to being strobed by a positive clock pulse and hold their output until the sequent positive clock pulse occurs. The sampling comparators 140 and 150 are strobed on opposite edges of the clock signal (CLK and CLKB). Thus, sampling comparator 140 is holding the digital output when sampling comparator 150 is comparing its inputs, and vice versa. This sampling scheme provides for a 10 nanosecond sampling of the analog signal $V_{IN}$ with a 20 nanosecond, fifty percent (50%) duty cycle clock signal.

The data latches 180, 190, 200, and 210 are driven by the outputs from sampling comparators 140, 150, 160, and 170, respectively. Each data latch is coupled to the corresponding sampler comparator and is strobed by the opposite phase of the clock signal relative to the sampler comparator coupled thereto. Thus, the outputs of complementing data latches change only on alternate clock edges.

The data latches and comparator circuitry for bits two, three, four, five, and six are identical to the circuitry of the overrange bit and bit one. The circuitry of the seventh and eighth bits is similar to the circuitry of the first six bits; however, due to limitations and the number of transitions which can practically be implemented in a differential amplifier cell, two differential amplifier cells 80 and 90 have been interconnected to provide the output for the seventh digital bit. Similarly, differential amplifier cells 100, 110, 120 and 130 have been interconnected to provide the output for the eighth digital output. The particulars of these differential amplifier cells and the coupling circuitry are explained in more detail below.

Detailed schematic diagrams of digital amplifier cells 20, 30, and 40 are illustrated in FIGS. 3, 4, and 5, respectively, and in FIG. 7 as well. Except for the number of differential amplifiers that act as level sensors in each cell and the reference voltages to which they are connected, the cells are similar physically and operationally. This fact is evident from an examination of FIG. 7. Each cell comprises a number of parallel differential amplifiers, that is, differentially coupled transistor pairs, to form an array with two input sides, i.e., an input side for the analog voltage and an input side for the reference voltages. At the analog voltage input side of the differential amplifiers, a transistor of each transistor pair has its base coupled to receive the input analog voltage, $V_{IN}$. At the reference voltage input side of the differential amplifier the base of the other transistor of the transistor pair is coupled to receive a transitional reference voltage from a multiple voltage reference source. The relative values of these transitional reference voltages are designated in the figures with 256 representing a full scale analog voltage. The collectors to each side of the differentially coupled transistor pairs are coupled together, alternately directly coupled and cross-coupled; that is, the collectors of each pair of differentially coupled transistors are connected to the collectors of the other pairs, alternately directly connected and cross-connected, to form two collector current paths. In other words, if each differentially coupled transistor pair is numbered consecutively to correspond to each of the monotonically increasing transitional reference voltages being received, the collectors of the even-numbered transistor pairs to each side of the array are directly coupled together and the collectors of the odd-numbered transistors to each side of the array are cross-coupled; the collectors to each side of the array are further mutually connected to form a collector current path for each side. These two collector current paths, in turn, are each tied to one of the emitters of a pair of transistors whose bases are commonly tied. The only exceptions are differential amplifier cells 10 and 20, each of which has only one differentially coupled transistor pair. In FIG. 3, the differentially coupled pair of transistors provide fast, alternate current paths. These alternate current paths conduct currents $i_1$ and $i_2$, respectively. Currents $i_1$ and $i_2$ are routed into the pull-up resistors 326 and 328 through transistors 322 and 324, and the voltages across resistor 326 and 328 thus produced are applied to the differential inputs of comparator 140.

In operation, an odd number of currents is summed into the current output nodes coupled to the inputs of the comparators. In the circuit of FIG. 3, current source 300 coupled to the differentially coupled transistor pair comprising transistors 310 and 320 provides the odd current. For the other cells, for example, those shown in FIGS. 4 and 5, there is an even number of thresholds and differentially coupled transistor pairs. In these cells, a ground coupled differential amplifier 330 and 340, the "dummy" differential amplifier, is required to meet the condition of having an odd number of currents. Specifically, current sources 330 and 340, in the circuits of FIGS. 4 and 5, respectively, are always switched into one side of the array.

The differential voltage between transition reference voltages is large enough to allow each differential amplifier to act as a one hundred percent (100%) switch. Each differential amplifier cell operates as follows: When the amplitude of the input analog signal $V_{IN}$ at one side of the parallel differential amplifiers substantially equals one of the transition reference voltages received by that cell at the other side of the amplifiers, the differential amplifiers, including the "dummy" amplifier, are switched on completely except one odd one, viz., the one equalling one of the transition reference voltages, such that an equal number of currents are being drawn at each side of the differential amplifiers. These currents at each side, then, are summed into output differential currents. Since there is always an odd number of currents to a differential amplifier cell, there is a remaining odd differential amplifier that is not completely switched on at one side, namely the one equalling a transition reference. The remaining differential amplifier will have its current directed equally through each side, e.g., through transistors 322 and 324, equally. This produces a balanced condition and the signals applied to the differential inputs to the comparator will have equal voltages. However, if $V_{IN}$ is slightly smaller or slightly greater than that received transition reference voltage, a differential voltage will be applied to the comparator inputs. Even though each differential amplifier requires approximately 200 millivolts to switch completely, the balance can be resolved arbitrarily close by the high gain of the sampling comparators. There are polarity differences in the comparator output resulting from the input analog voltage, $V_{IN}$, being slightly smaller or slightly greater than the selected transitional reference voltage. The polarity corresponds to an odd or even number of thresholds. As an illustration, FIG. 6(a) shows a cell corresponding to differential amplifier cell 50 (M=4). The signal ($V_{OUT}$) applied to sampling comparator 350 as a function of a monotonically increasing input analog signal is illustrated in FIG. 6(b). As described above, $V_{OUT}$ passes through zero voltage in response to the input analog voltage being substantially equal to one of the received transitional reference voltages. The resulting digital output for this cell is illustrated in FIG. 6(c).

In the preferred embodiment of the present invention, it has been determined that when more than thirty-two (32) differential transistor pairs are used in a differential amplifier, the thresholds of adjacent differential transistor pairs are too close together. In other words, the switching of sequential devices occurs so closely together that a number of devices are switching at once. While switching then, the gain of a device is reduced. This phenomenon causes a decrease in the effective gain of the overall differential amplifier cells. A substantially reduced effective gain results in an inability to distinguish received data from the differential amplifier cell. Accordingly, this problem has been avoided by limiting the maximum number of differential amplifiers in any cell to thirty-two (32) for a 256 full scale analog voltage, for example, as in FIGS. 7(g) and 7(h). This gives a minimum threshold spacing of 80 millivolts. To allow more than thirty-two (32) quantization levels per output bit, differential amplifier cells for bits seven and eight (M=7 and 8) have been logically combined as illustrated in FIG. 2. In particular, in the case of M=7, the monotonically increasing transitional reference voltages are alternately applied to, i.e., interspaced between, two differential amplifier cells 80 and 90. The outputs from these cells are then amplified by associated comparators, and the outputs of the comparators are logically combined, for example, by exclusive NOR gates 400 and 450, to provide the seventh encoded bit. In the case of M=8, the monotonically increasing transitional reference voltages are interspaced among four differential amplifier cells 100, 110, 120, and 130. In a manner similar to the case of M=7, the outputs of the comparators associated with cells 100, 110, 120, and 130 are logically combined. For example, the outputs from differential amplifier cells 100 and 130 are logically combined by exclusive NOR gates 500 and 550, the outputs from cells 110 and 120 are logically combined by exclusive NOR gates 530 and 540, and the outputs of the exclusive NOR gates are further logically combined by OR gates 510 and 520 to finally provide bit eight.

The transitional reference voltages coupled to the respective differential amplifier cells are identified and illustrated in FIGS. 3, 4, 5, 6, and, in particular, 7. A minimum threshold spacing of 80 millivolts in any given differential amplifier cell assures sufficient gain for every bit. The reference voltages applied to the sets of thirty-two (32) differential amplifier cells for the two least significant bits are staggered to provide for a minimum spacing of 80 millivolts between reference voltages in any cell. The logical combination of the four sets of transitional reference voltages in the least significant bit provides for a resolution of 128 quantization levels spaced 20 millivolts apart.

Sampling comparators 140 and 150 and data latches 180 and 190 are illustrated in the detailed schematic diagram of FIG. 8. The other sampling comparators and data latches of the preferred embodiment of the present invention incorporates similar circuitry. The differential output from the differential amplifier cell 10 of FIG. 2 is applied to the sampling comparators 140 and 150 via inputs IN and INB. When the clock signal CLK is in its high state (4.2 V) and CLKB is in its low state (3.6 V), current flows from the +5 volt reference through resistor R1A and transistor Q2A to the IN terminal. Current also flows from the 5-volt reference to resistor R2A, and transistor Q1A to the INB terminal. This places comparator 140 in its comparison or sampling mode. A differential current between the IN and INB inputs results in a differential voltage between the collectors of transistors Q2A and Q1A.

Resistors R1B and R2B have relatively small values, thus, the voltages on the collectors of Q2A and Q1A are applied to the bases of transistors Q5 and Q6, respectively. Since transistors Q5 and Q6 are coupled as emitter followers, any voltage differential applied to their bases also appears at the respective emitters. Transistors Q9 and Q10 have emitters coupled to the emitters of transistors Q5 and Q6, respectively, and operate as zener diodes. An approximate 4-volt signal at their emitters having approximately 50–100 millivolt differential is shifted to an approximate −2 volt signal at their bases, the differential output of the comparator 140.

The comparison function of sampling comparator 140 is implemented by transistors Q1 and Q2 having their bases coupled to the emitters of transistors Q5 and Q6, respectively. A small fixed current from the current source Q16 and the 3K ohm resistor coupled to its emitter provides a current of approximately 150 microamperes to the emitters of differentially coupled transistor pair Q1 and Q2. Any voltage differential at the emitters of transistors Q5 and Q6 resulting from a difference in the currents going through terminals IN and INB appears as a voltage differential across the bases of transistors Q1 and Q2. The collectors of transistors Q1 and Q2 are coupled to the bases of transistors Q6 and Q5, respectively, creating a positive feedback loop. Specifically, if the current drawn by terminal INB decreases, the voltage drop across resistor R2A will decrease, causing a voltage at the base and emitter of transistor Q6 and the voltage at the base of transistor Q2 to increase. This increased voltage at the base of transistor Q2 will cause transistor Q2 to draw additional current through resistors R1A and R2A, causing the voltage at the base and emitter of transistor Q5 and the base of transistor Q1 to decrease. The value of the current source has been chosen to keep the loop gain less than 1. Thus, the differentially coupled transistors Q1 and Q2 act as a high gain amplifier and the sampling comparator 140 operates in a sampling and comparing mode in response to a high CLK signal and a low CLKB signal.

Comparator 140 operates in a latch mode in response to a low CLK signal and a high CLKB clock signal. Specifically, a low CLK signal causes transistors Q2A and Q1A to stop conducting any current from the input terminals IN and INB, respectively. Further, a high CLK' signal, which corresponds to a high CLKB signal (−0.8 volts), is coupled to the base of transistor Q13. Transistor Q13 in turn couples a relatively large current to the emitters of transistors Q1 and Q2. This relatively large current results in a loop gain greater than one, causing the circuit to lock into one of two states depending upon any relative imbalance between the voltages at the bases of transistors Q1 and Q2.

Comparator 150 operates in a complementary fashion. Specifically, comparator 150 operates in a sample and comparison mode in response to a clock signal CLKB having a high state, and it operates in a latch and hold mode in response to the CLK' clock signal, which corresponds to the CLK signal except for level, reaching a high (−0.8) state.

The data latch 180 has inputs coupled to the level shifter transistors Q9 and Q10 of the sampling comparator 140. This signal supplied to the differential amplifier comprising transistors 220 and 221 restores the output to a single level at the collector of transistor Q20. The restored signal is applied to a conventional EFL RS latch. This latch is described in the *IEEE Journal of Solid State Circuits*, Volume SC-8, No. 5, October 1973, in an article entitled, "Emitter Function Logic-Logic Family for LSI", by Z. E. Skokan.

The preferred embodiment of the present invention is in a configuration of an array of 256 differential amplifiers. The collectors of the 256 differential amplifiers are tied into twenty-six (26) sampler comparator circuits. The twenty-six (26) sampler comparator circuits drive six (6) exclusive NOR-gates and the eighteen (18) output buffers. Further, additional circuitry supplies the clocks and bias voltages for the circuit. FIG. 9 illustrates the basic differential amplifier used in the differential amplifier cells. This basic differential amplifier comprises a differential pair with an active current source.

Detailed schematics of the additional circuitry of the preferred embodiment are illustrated in FIGS. 9–16. These circuits are standard EFL library circuits except for the bias supply illustrated in FIG. 12. This supply is similar to the VCS supply illustrated in FIG. 11 except that it supplies a lower voltage. This lower voltage is required to drive the current source of the analog-to-digital array. The analog-to-digital differential amplifier cells have current sources requiring a lower voltage because they operate at a current of only 200 microamperes. This smaller current requires a smaller resistance and saves size in the integrated circuit embodiment of the amplifier cell arrays.

We claim:
1. An analog-to-digital Gray code encoder for providing a digital signal in response to an analog signal having a particular slew rate, the encoder comprising:
a plurality of comparators each having M number of differential means, each having a differential output port, for providing, in response to said analog signal, an encoder voltage output, said M being an integer, and each of said differential means being alternately direct-coupled and cross-coupled at its differential output port to form a common differential output port in parallel;
a current source coupled to one side of said common differential output port to provide a dummy differential amplifier in those comparators where M is an even integer; and not in those comparators where M is an odd integer
amplifying means for providing, in response to said encoder voltage, an encoded bit for a converter output of parallel bits having a loss of bit accuracy that progresses from least to most significant bit as the slew rate is increased.

2. The analog-to-digital Gray code encoder as in claim 1 wherein said M differential means comprise:
a. source means for providing reference voltages; and
b. pluralities of even- and odd-numbered comparator means for providing first and second output voltages in response to a comparison of amplitudes of said analog signal and said reference voltages;

and said amplifying means comprises:
a. first input port for receiving said first output voltages of said plurality of odd-numbered comparator means and said second output voltages of said plurality of even-numbered comparator means; and
b. second input port for receiving said first output voltages of said plurality of even-numbered comparator means and said second voltages of said output plurality of odd-numbered comparator means.

3. The analog-to-digital Gray code encoder as in claim 1, wherein: said M differential means comprise:
a source means for providing $2^N-1$ reference voltages which increase monotonically with n, wherein N is an integer greater than 0, and n is an integer designating one of said reference voltages such that $1 \leq n \leq 2^N-1$;
b. $2^N-1$ level sensors, each level sensor being designated by m, wherein m is an integer such that $1 \leq m \leq 2^N-1$;
c. a first input port corresponding to each of said level sensors coupled to said source means for receiving a reference voltage n such that m=n;
d. a second input port corresponding to each of said level sensors for receiving said analog signal; and
e. first and second output ports corresponding to each of said level sensors to provide first and second voltages in response to the analog signal having an amplitude greater or less than the received reference voltage at said corresponding first input port; and said amplifying means comprises:
a. an output gain element for receiving said first and second voltages and providing a differential output;
b. a differential first input port for said output gain element coupled to said first output port of said level sensors which are odd-numbered and to said second output port of said level sensors which are even-numbered;
c. a differential second input port for said output gain element coupled to said first output port of said level sensors which are even-numbered and to said second output port of said level sensors which are odd-numbered; and
d. a differential output port for said output gain element for providing a digital signal in response to the voltages received by said differential first and second input ports.

4. The analog-to-digital Gray code encoder as in claim 1 wherein: said M differential means comprise:
a. source means for providing $2^N-1$ reference voltages which increase monotonically with n, wherein n is an integer greater than 0, and n is an integer designating one of said reference voltages such that $1 \leq n \leq 2^N-1$;
b. supply means for providing a supply voltage;
c. first and second resistors, each resistor having first and second terminals, wherein said first terminals are coupled to said supply means;
d. buffer means coupled to said second terminals for providing buffered second terminals;
e. $2^N-1$ transistor pairs, each pair and each transistor thereof designated by m, wherein m is an integer such that $1 \leq m \leq 2^N-1$, and each of said pair comprises first and second transistors, where the emitters of said first and second transistors are coupled together, the collector of each first transistor is coupled to the buffered second terminal of said first resistor, and the collector of each second transistor is coupled to the buffered second terminal of said second resistor, the bases of said first transistors designated by m which is odd-numbered and the bases of said second transistors designed by m which is even-numbered are coupled to receive said analog signal, and the bases of said second transistors designated by m which is odd-numbered and the bases of said first transistors designated by m which is even-numbered are coupled to receive reference voltages n where m=n;
f. first current source means coupled to said together-coupled emitters for draining a current having an amplitude i; and
g. second current source means coupled to the buffered second terminal of said second resistor for draining a current having an amplitude i.

5. The analog-to-digital Gray code encoder as in claim 4, wherein said amplifying means comprises a gain element having differential inputs coupled to the unbuffered second terminals of said first and second resistors for providing the digital signal in response to the relative values of the signals on the input ports thereof.

6. An analog-to-digital Gray code flash converter for providing a multi-bit digital signal in response to an analog signal, comprising a plurality of analog-to-digital Gray code encoders as in claims 3 or 4, wherein said encoders are characterized by increasing integer values of N and by the lowest value of N providing the most significant bit of the multi-bit digital signal; and said reference voltages of the encoders are interspaced such that each encoder has two reference voltages having amplitudes between the amplitudes of sequent reference voltages of the encoder for producing the next most significant bit.

7. An analog-to-digital Gray code flash converter for providing a digital signal in response to an analog signal comprising a plurality of analog-to-digital Gray code encoders, said encoders each comprising:
encoding means for providing, in response to said analog signal, an output of encoder voltages in parallel bits ranging from lease significant bit to most significant bit, said encoder voltages representing the amplitude of an applied analog signal, said encoding means comprising:
a. source means for providing $2^N-1$ reference voltages which increase monotonically with n, wherein N is an integer greater than 0, and n is an integer designating one of said reference voltages such that $1 \leq n \leq 2^N-1$;
b. $2^N-1$ level sensors, each level sensor being designated by m, wherein m is an integer such that $1 \leq m \leq 2-1$;
c. a first input port corresponding to each of said level sensors coupled to said source means for receiving a reference voltage n such that n=m;
d. a second input port corresponding to each of said level sensors for receiving said analog signal; and
e. first and second output ports corresponding to each of said level sensors to provide first and second output voltages in response to the analog signal having an amplitude greater or less than the received reference voltage at said corresponding first input port; and amplifying means for providing, in response to said encoder voltages, an output of parallel bits, said amplifying means comprising:

a. an output gain element for receiving said first and second output voltages and providing a differential output;

b. a differential first input port for said output gain element coupled to said first output port of said level sensors which are odd-numbered and to said second output port of said level sensors which are even-numbered;

c. a differential second input port for said output gain element coupled to said first output port of said level sensors which are even-numbered and to said second output port of said level sensors which are odd-numbered; and d. a differential output port of said output gain element for providing a digital signal in response to the voltages received by said differential first and second input ports;

wherein said encoders are characterized by the same value of N; said reference voltages are alternatively interspaced; and said converter further comprising means for performing an exclusive NOR operation on the digital signals of said encoders for providing the digital signal of said converter.

8. The analog-to-digital converter as in claim 7, wherein said encoding means further comprises:

a. supply means for providing a supply voltage;

b. first and second resistors, each resistor having first and second terminals, wherein said first terminals are coupled to said supply means;

c. buffer means coupled to said second terminals for providing buffered second terminals;

d. $2^N-1$ transistor pairs, each pair and each transistor thereof designated by m, wherein m is an integer such that $1 \leq m \leq 2^N-1$, and each of said pair comprises first and second transistors, where the emitters of said first and second transistors are coupled together, the collector of each first transistor is coupled to the buffered second terminal of said first resistor, and the collector of each second transistor is coupled to the buffered second terminal of said second resistor, the bases of said first transistors designated by m which is odd-numbered and the bases of said second transistors designated by m which is even-numbered are coupled to receive said analog signal, and the bases of said second transistors designated by m which is odd-numbered and the bases of said first transistors designated by m which is even-numbered are coupled to receive reference voltages n, where n=m;

e. first current source means coupled to said together-coupled emitters for draining a current having an amplitude i; and f. second current source means coupled to the buffered second terminal of said second resistor for draining a current having an amplitude i.

9. The analog-to-digital Gray code flash converter as in claim 7 comprising first, second, third, and fourth analog-to-digital Gray encoders, wherein said first, second, third, and fourth encoders are characterized by the same value of N; said reference voltages are alternately interspaced among said first, second, third, and fourth encoders; and said converter further comprising:

first means for performing an exclusive NOR operation on the digital signals of said first and fourth encoders;

second means for performing an exclusive NOR operation on the digital signals of said second and third encoders; and third means for performing an OR operation on the logical results of said first and second means for providing the digital signal of said converter.

10. The analog-to-digital Gray code flash converter as in claim 8 comprising first, second, third, and fourth analog-to-digital Gray encoders, wherein said first, second, third, and fourth encoders are characterized by the same value of N; said reference voltages are alternately interspaced among said first, second, third, and fourth encoders; and said converter further comprising:

first means for performing an exclusive NOR operation on the digital signals of said first and fourth encoders;

second means for performing an exclusive NOR operation on the digital signals of said second and third encoders; and third means for performing an OR operation on the logical results of said first and second means for providing the digital signal of said converter.

* * * * *

UNITED STATES PATENT AND TRADEMARK OFFICE
CERTIFICATE OF CORRECTION

PATENT NO. : 4,386,339
DATED : May 31, 1983
INVENTOR(S) : Tim W. Henry and Mark P. Morgenthaler It is certified that error appears in the above—identified patent and that said Letters Patent is hereby corrected as shown below:

Column 2, line 15 delete "same" and insert --some--.

Column 9, line 17 delete "output".

Column 9, line 17 before "voltages" insert --output--.

Column 9, line 21 delete "a source" and insert --a. source--.

Signed and Sealed this

Sixteenth Day of August 1983

[SEAL]

Attest:

GERALD J. MOSSINGHOFF

Attesting Officer

Commissioner of Patents and Trademarks